United States Patent

Burns, Jr. et al.

[11] Patent Number: 5,759,920
[45] Date of Patent: Jun. 2, 1998

[54] PROCESS FOR MAKING DOPED POLYSILICON LAYERS ON SIDEWALLS

[75] Inventors: Stuart Mcallister Burns, Jr., Ridgefield, Conn.; Hussein Ibrahim Hanafi, Goldens Bridge; Waldemar Walter Kocon, Wappingers Falls, both of N.Y.

[73] Assignee: International Business Machines Corporation, Armonk, N.Y.

[21] Appl. No.: 749,748

[22] Filed: Nov. 15, 1996

[51] Int. Cl.$^6$ .................................................. H01L 21/00
[52] U.S. Cl. ........................... 438/696; 216/62; 438/712; 438/734; 438/304
[58] Field of Search ...................... 438/696, 712, 438/734, 740, 304; 216/2, 62, 87, 67

[56] References Cited

U.S. PATENT DOCUMENTS

| | | |
|---|---|---|
| 4,714,519 | 12/1987 | Pfiester ................................ 438/304 |
| 4,767,722 | 8/1988 | Blanchard. |
| 5,124,764 | 6/1992 | Mori. |
| 5,314,575 | 5/1994 | Yanagida. |
| 5,336,365 | 8/1994 | Goda et al.. |
| 5,401,358 | 3/1995 | Kadomura. |
| 5,459,091 | 10/1995 | Hwang. |
| 5,641,380 | 6/1997 | Yamazaki et al. ................... 438/696 X |

OTHER PUBLICATIONS

W. Hwang et al., "Dense SRAM Cell Structure for 16 MB SRAM Chip and Beyond" IBM Technical Disclosure Bulletin, vol. 33, No. 9, Feb., 1991, pp. 276–278.

*Primary Examiner*—William Powell

[57] ABSTRACT

Method for creating a doped polysilicon layer of accurate shape on a sidewall of a semiconductor structure. According to the present method, a doped polysilicon film covering at least part of said semiconductor structure and of said sidewall is formed. This polysilicon film then undergoes a reactive ion etching (RIE) process providing for a high etch rate of said polysilicon film to approximately define the shape of the polysilicon layer on said sidewall. Then, said polysilicon film undergoes a second reactive ion etching process. This second reactive ion etching process is a low polysilicon etch rate process such that non-uniformities of the surface of said polysilicon film are removed by sputtering.

21 Claims, 8 Drawing Sheets

PROCESS FOR MAKING DOPED POLYSILICON LAYERS ON SIDEWALLS

TECHNICAL FIELD

The present invention relates to a method for the creation of doped polysilicon layers on vertical walls, and in particular doped polysilicon layers serving as spacers for the formation of semiconductor devices, such as field effect transistors.

BACKGROUND OF THE INVENTION

In order to be able to make memory, logic and other devices of higher integration density than currently feasible, one has to find a way to further scale down certain components thereof.

Vertically arranged polysilicon layers play an important role in different such devices. They are of particular importance in vertical field effect transistors (FETs), dynamic random access memory metal oxide semiconductor (DRAM) FETs, complementary metal oxide semiconductor (CMOS) FETs, and the like, where the vertical polysilicon layer (also referred to as spacer), if doped appropriately, serves as gate conductor.

It is a prerequisite, no matter where such doped polysilicon layers are employed, that they can be accurately made. Furthermore, reproducibility is crucial if the process for making these polysilicon layers is to be used in mass fabrication.

Usually, the doping of polysilicon is inhomogenous, i.e., some portions of the polysilicon are doped higher than others. It is also possible that the grain structure of the polysilicon is not uniform throughout the film. These reasons lead to uneven and rough surfaces of vertical polysilicon layers, if one etches the polysilicon to define its shape and size. This is mainly because the etch rate in a reactive ion etching (RIE) system depends on the dopant concentration in polysilicon. Due to this, some portions of the polysilicon etch more easily than others.

Vertical polysilicon layers with uneven and rough surfaces are not suited for use in semiconductor technology. There is currently no feasible means to fabricate an accurate polysilicon layer on a vertical or sloped sidewall.

It is an object of the present invention to provide a method for the creation of doped polysilicon layers of accurate size and shape.

It is another object of the present invention to provide a method which is suited for use in a manufacturing line.

SUMMARY OF THE INVENTION

The present invention concerns a method for creating a doped polysilicon layer of accurate shape on a sidewall of a semiconductor structure. The inventive method comprises the following steps:
- depositing a polysilicon film covering part of said semiconductor structure and part of said sidewall,
- doping said polysilicon film,
- etching said polysilicon film using a reactive ion etching (RIE) process providing for a high etch rate of said polysilicon film, in order to define the approximate shape of said polysilicon layer on said sidewall,
- etching said polysilicon film using a low polysilicon etch rate reactive ion etching process applying a high bias voltage such that non-uniformities of the surface of said polysilicon layer are removed by sputtering.

The present invention further concerns a method for making a vertical field effect transistor comprising a vertical polysilicon layer.

Under certain circumstances, it may be advantageous to dope the polysilicon film while it is deposited. Alternatively, it may be doped after formation.

Instead of using a mask for definition of the approximate shape of the polysilicon layer to be formed, one may use a maskless process. This maskless process is advantageous if one makes vertical FETs, for example.

One may stop the first reactive ion etching step before all of the polysilicon layer is removed from horizontal surfaces of the semiconductor structure. In this case, a third RIE step has to be carried out after the second RIE step. This third RIE step is carried out to remove the portion of said polysilicon which remained on said horizontal surfaces when the first RIE step was stopped. This three-step approach is advantageous if one wants to ensure that the horizontal surfaces of the semiconductor structure are not damaged.

It is another advantage of the inventive process, that the RIE steps can be carried out in one and the same RIE processing chamber.

It is another advantage that the present process is compatible with current semiconductor manufacturing processes.

DESCRIPTION OF THE DRAWINGS

The invention is described in detail below with reference to the following schematic drawings.

DETAILED DESCRIPTION OF THE PRESENT INVENTION

In the present context it is assumed that the polysilicon is either n-doped or p-doped. It can be doped either during deposition, or subsequent to deposition. The following dopants are suited for the doping of polysilicon: phosphorus, arsenic, boron, just to give some examples. The concentration of dopants typically is in the range of $1 \times 10^{18}/cm^3$ to $1 \times 10^{21}/cm^3$. Depending on the purpose which the doped polysilicon layer is intended to serve, the concentration of dopants may be below or above the mentioned range.

Polysilicon (also referred to as polycrystalline silicon) can be formed using chemical vapor deposition (CVD), or low pressure chemical vapor deposition (LPCVD), as well as other known processes. Polysilicon is a solid composed of a myriad of small single crystal regions.

The expression "semiconductor structure" is meant to cover any kind of structure formed on. or in a substrate. Such a structure may comprise different semiconductor and other kind of layers. Partially processed semiconductor devices are herein also referred to as semiconductor structures, for sake of simplicity. When referring to a "sidewall", any kind of surface of a semiconductor structure is meant which is sloped with respect to the plane of the substrate of said semiconductor structure. Of particular importance are sidewalls which are perpendicular with respect to said substrate's plane.

Instead of reactive ion etching (RIE). ion beam etching (IBE). or chemically-assisted ion beam etching (CAIBE) can be used in connection with the present invention. Well suited for RIE etching are the species Cl, Br, C, Ar, He, and F, or any combination thereof. In particular the $Cl_2$, HBr, He, $CHF_3$, $CF_4$, and Ar plasmas showed good results.

Figure 1A:
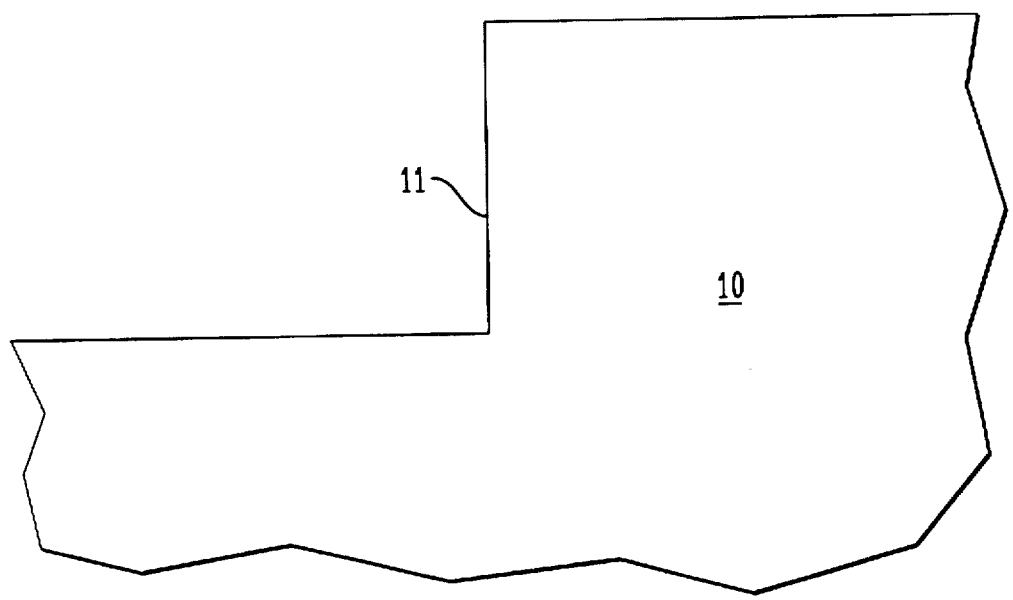
FIG. 1A–1G is a sequence of schematic cross-sections of a semiconductor structure used to describe steps of the inventive method where a mask is used for the definition of the approximate shape and size of the polysilicon layer to be formed.

The present invention is now described in connection with a sequence of FIGS. 1A through 1G. In FIG. 1A, a cross-sectional view of a semiconductor structure 10 with a perpendicular sidewall 11 is shown.

Figure 1B:
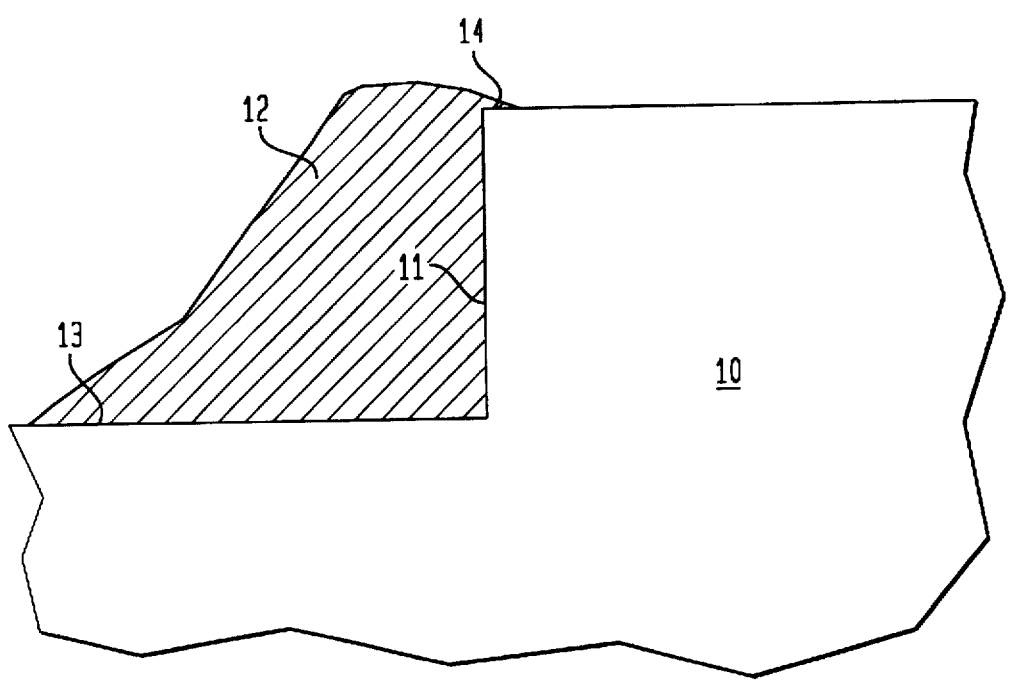

According to the present invention, a polysilicon film 12 is deposited, as illustrated in FIG. 1B. In the present example, this polysilicon film 12 covers not only the sidewall 11, but also part of the surfaces 13 and 14 next to the sidewall 11. The polysilicon film 12 may be deposited in a low pressure chemical vapor deposition (LPCVD) reactor, using dichlorosilane and phosphine (as dopant e.g.) at a temperature above 600 degrees centigrade. for example.

Figure 1C:
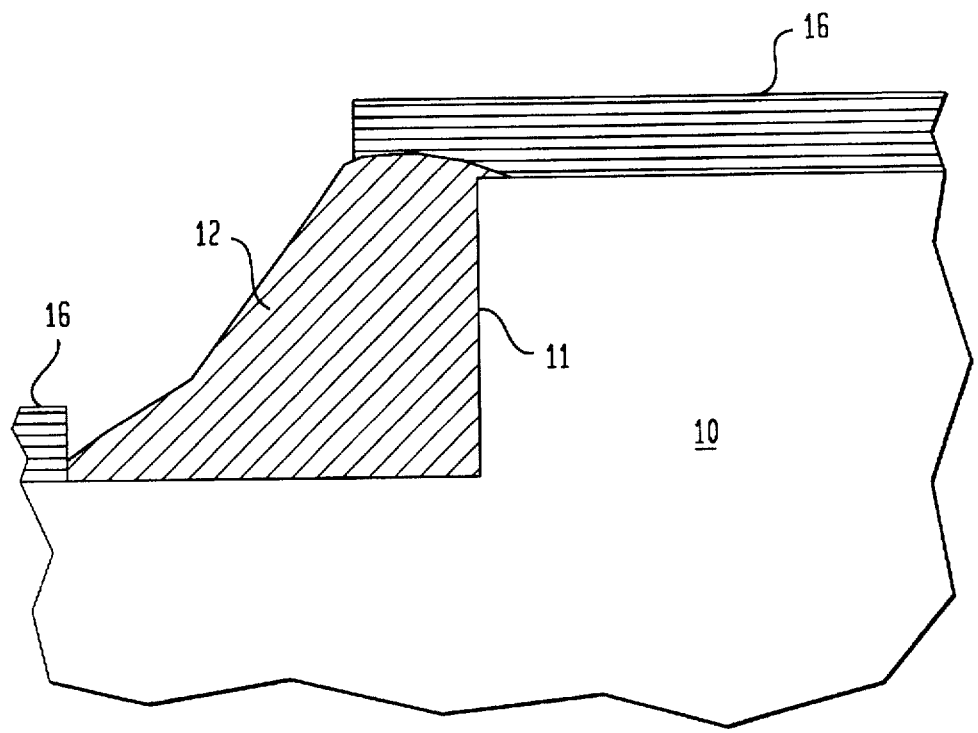

In the present example, the ratio between the thickness of the polysilicon film 12 and the heights of the sidewall 11 is 0.5 and more. Under these circumstances. the polysilicon film 12 usually does not follow the contours of the step (13, 11, 14) in the semiconductor structure's surface. It rather forms a deposition close to the step. In such a situation, it may be advantageous to employ a mask in order to define the approximate shape of the polysilicon layer to be formed on the sidewall 11, as illustrated in FIG. 1C and described in the following. A maskless process will be addressed later.

Figure 1D:
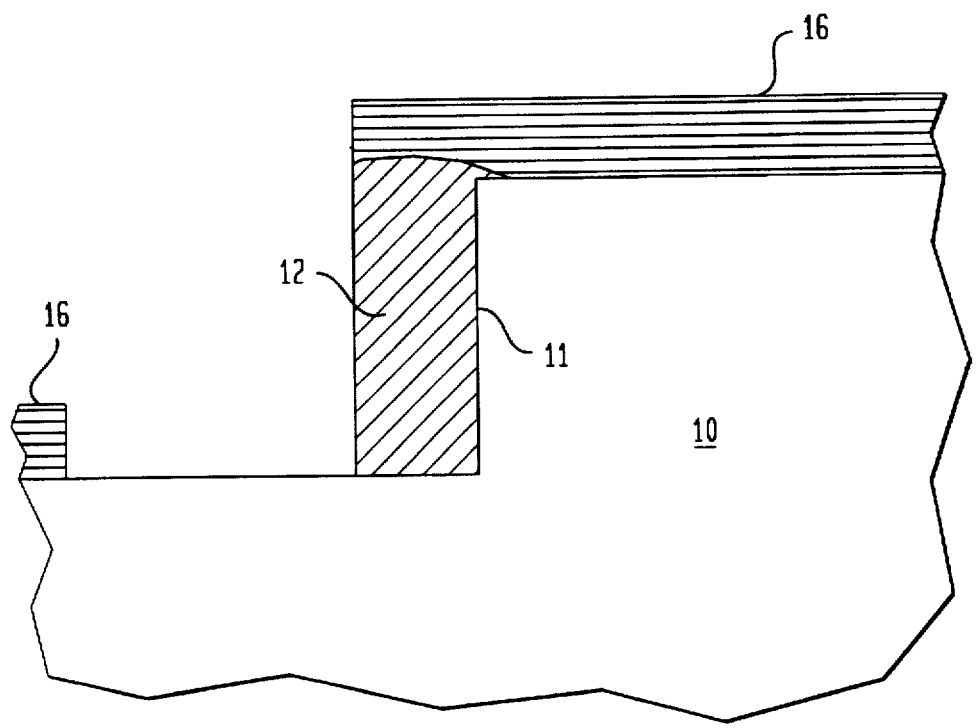
Figure 1E:
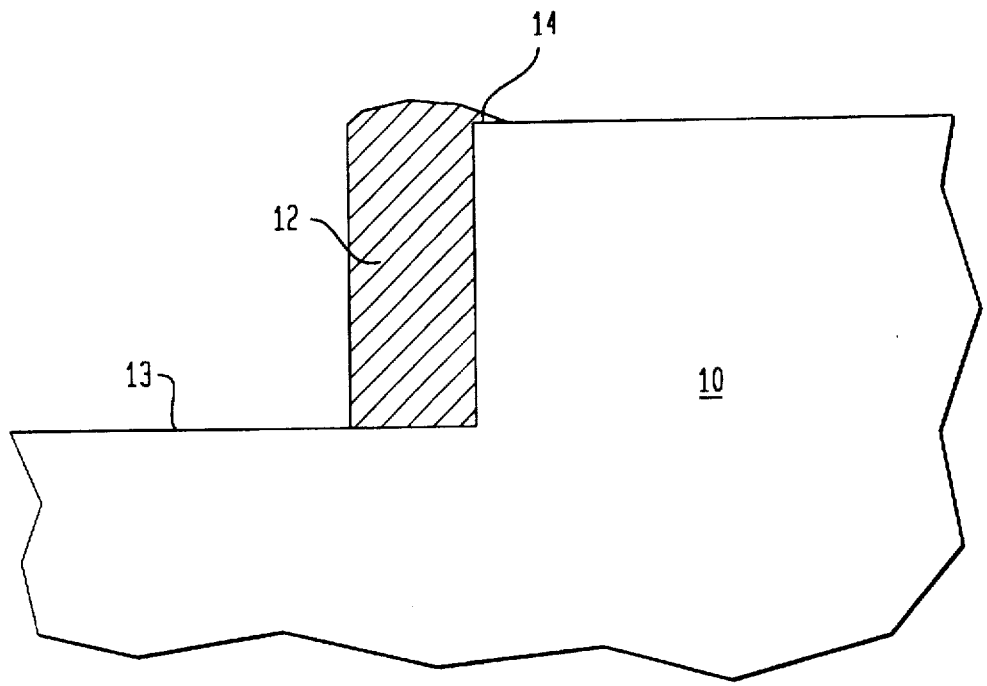
Figure 1F:
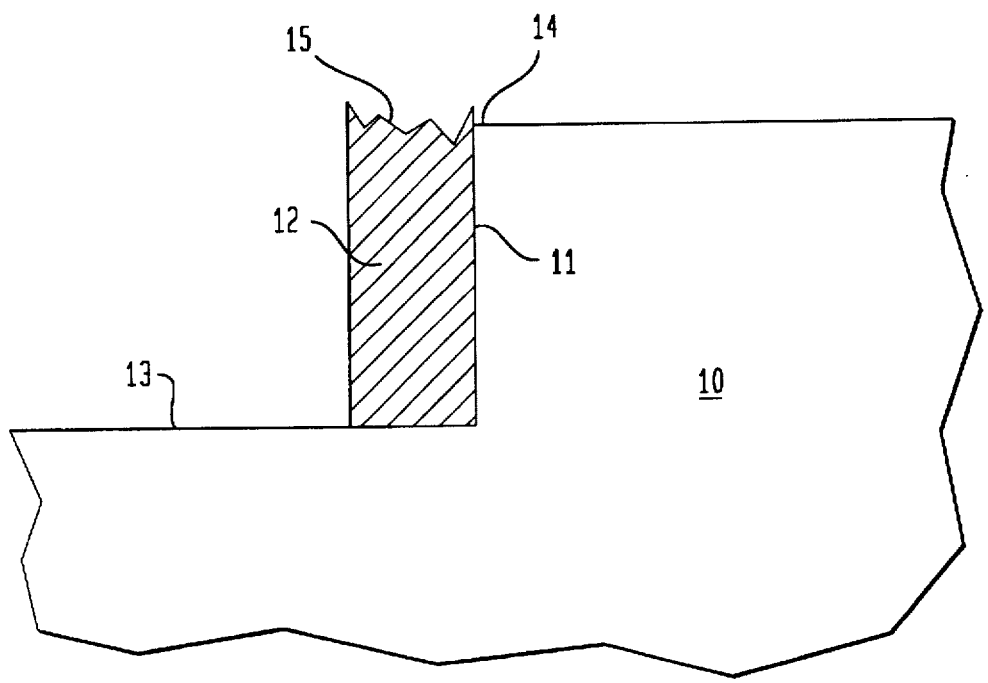

The polysilicon film 12 is now patterned by photolithography, for example, a process that includes the coating of the semiconductor structure 10 with a photoresist film (not illustrated), exposure of the photoresist film with the appropriate mask, and developing the exposed photoresist to create the desired photoresist etch mask 16 for subsequent pattern transfer in the underlying polysilicon film 12, as illustrated in FIG. 1C. Now, a first reactive ion etching (RIE) step is carried out to define the approximate shape of the polysilicon layer 12 to be formed. The outcome of this step is schematically shown in FIG. 1D. After this first RIE step, the photoresist mask 16 is removed. This can be done by chemically stripping it in a solvent bath, for example. The polysilicon layer 12 still overlaps part of the horizontal surface 14, as illustrated in FIG. 1E. In a next RIE step, the overlapping portion of the polysilicon layer 12 is removed. Since the distribution of the dopants and/or the grain structure in the polysilicon film 12 is usually inhomogeneous, the surface 15 of the polysilicon layer 12 is uneven and rough, as shown in FIG. 1F, after it underwent this RIE process. One reason for this is the differences in the etch rate of portions of the polysilicon which are higher doped than portions which are doped less. The RIE conditions have to be chosen carefully such that the approximate shape of the polysilicon layer 12 is obtained. Well suited for the first and second RIE etching steps are plasmas comprising the species Cl, Br, C, Ar, and F, or any combination thereof. Particularly well suited is a standard $Cl_2$ and HBr plasma at a voltage of about 50 Volts, for example.

Figure 1G:
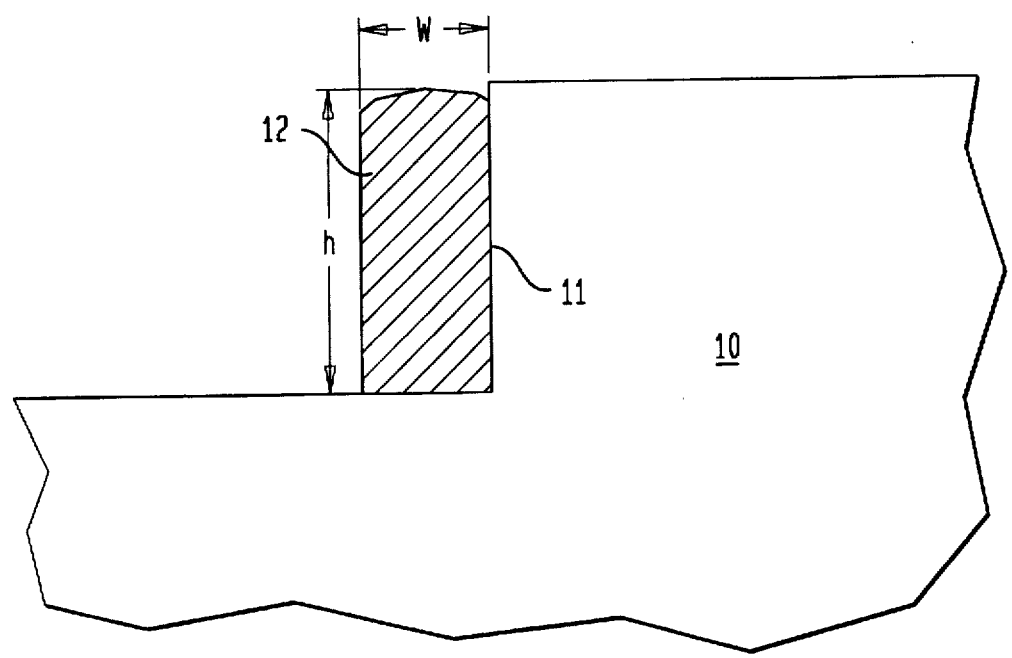

According to the present invention, another etch step is now carried out. This third etch step is an RIE step where the etch conditions (also known as RIE etching parameters) are carefully set such that the non-uniformities at the surface 15 are removed by sputtering without attacking the surfaces 13 and 14 of the semiconductor structure, as illustrated in FIG. 1G. The conditions for the third RIE etch step are chosen such that it is selective with respect to the underlying semiconductor structure, i.e., the 'ear'-like structures 15 of the polysilicon 12 and not the surfaces 13 and 14 are etched. The RIE etch selectivity of polysilicon to the surrounding semiconductor structure should be high, preferably more than 5. This is achieved by applying a high bias voltage during the second RIE step which provides for an ion-assisted sputtering. Typically, the bias voltage should be 800V and more. The following combination of gases is well suited: $CF_4$, $CHF_3$ and Ar. Depending on the underlying semiconductor structure, an appropriate mask may be employed which protects sensitive areas thereof.

Doped polysilicon layers of almost any size can be made using the inventive process. The inventive process is particularly well suited to make polysilicon layers having a width w between 10 nm and 500 nm and a height h between 100 nm and 10 μm (see FIG. 1G).

Figure 2A:
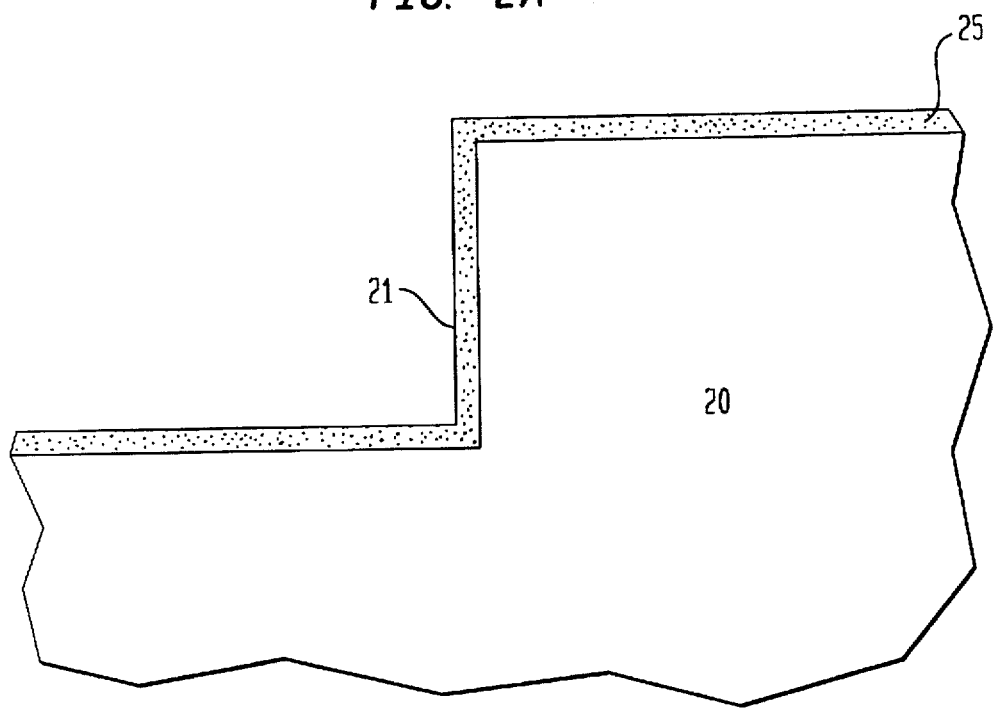
FIG. 2A–2D is a sequence of schematic cross-sections of a semiconductor structure used to describe steps of the inventive method where no mask is used for the definition of the approximate shape and size of the polysilicon layer to be formed.

Another sequence of steps, in accordance with the present invention, is illustrated in FIGS. 2A–2D and described in the following. A semiconductor structure 20 with a vertical sidewall 21 serves as basis for the fabrication of a polysilicon layer. As shown in FIG. 2A, the surface of this semiconductor structure 20 is covered by a thin protective layer 25. This protective layer 25 may comprise an oxide (e.g. $SiO_2$) or nitride.

Figure 2B:
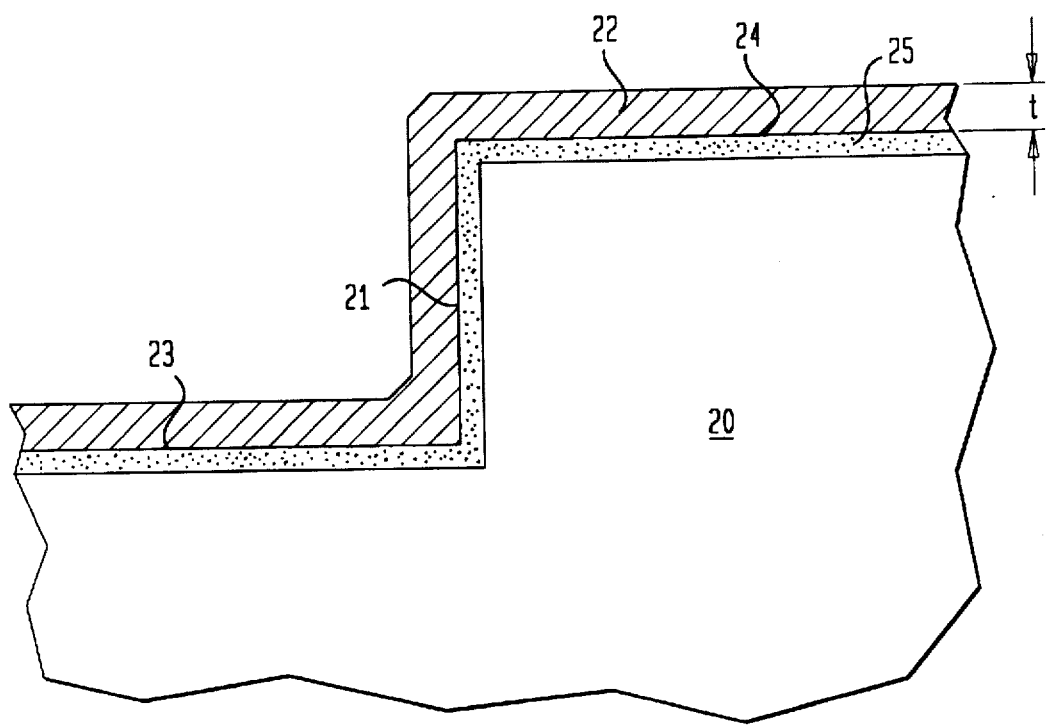

First, a polysilicon layer 22 is formed, as shown in FIG. 2B. This polysilicon layer 22 is doped after its deposition. In this example, the ratio between the thickness t of the polysilicon film 22 and the heights of the sidewall 21 is less than 0.5. Under these circumstances, the polysilicon film 22 conforms to the surface of the structure 20. In this case, the thickness t of layer 22 should be about the same as the width w of the polysilicon layer 22 to be formed.

Figure 2C:
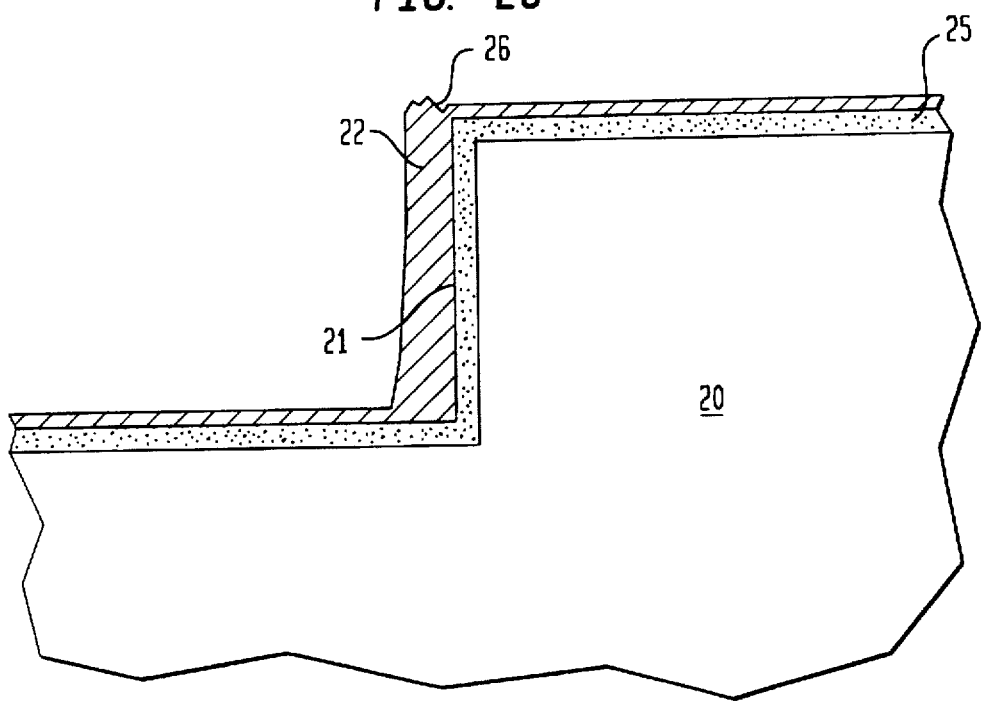

Given the special circumstances, there is no need for a mask. The semiconductor structure 20 undergoes a first RIE etch step which removes most of the polysilicon from the horizontal surfaces 23 and 24. As shown in FIG. 2C, this first RIE step may be interrupted before all of the polysilicon layer 22 is removed, i.e., a thin polysilicon layer is left on the horizontal surfaces of the structure 20. The RIE etch parameters have to be chosen such that a high degree of anisotropy is ensured. First, chlorine plasmas were found to etch polysilicon very anisotropically and exhibited excellent selectivity over $SiO_2$ (which may serve as protective layer 25), but they etch Si more slowly than fluorine containing gases. Thus, RIE etching with gases comprising both chlorine and fluorine are preferred for etching polysilicon. Due to the high anisotropy of the first RIE step, essentially a vertical polysilicon layer 22 and thin horizontal polysilicon layers are formed, as illustrated in FIG. 2C. The approximate shape and size of the vertical polysilicon layer 22 is now defined. As in the first example, there are 'ear'-like structures 26 at the uppermost portion of layer 22 (see FIG. 2C).

According to the present invention, now a second RIE step is carried out. As described in connection with the first sequence of steps, this etch step is an RIE step where the etch conditions are chosen such that the non-uniformities 26 at the surface are removed by sputtering leaving the horizontal portions of the polysilicon layer 22 almost unaffected. The conditions for the second RIE etch step are chosen such that it is selective with respect to the horizontal polysilicon, i.e., the 'ear'-like structures 26 of the polysilicon 22 and not the horizontal portions are etched. The RIE etch selectivity of the polysilicon "ears" to the horizontal polysilicon layers should be high. This is achieved by applying a high bias voltage during the second RIE step which provides for an ion-assisted sputtering.

Now, another RIE step—which may be similar to the first RIE step—is required to remove the remaining horizontal portions of the polysilicon layer 22. This RIE etch should be selective such that the protective layer 25 is not attacked to a great extent.

Figure 2D:
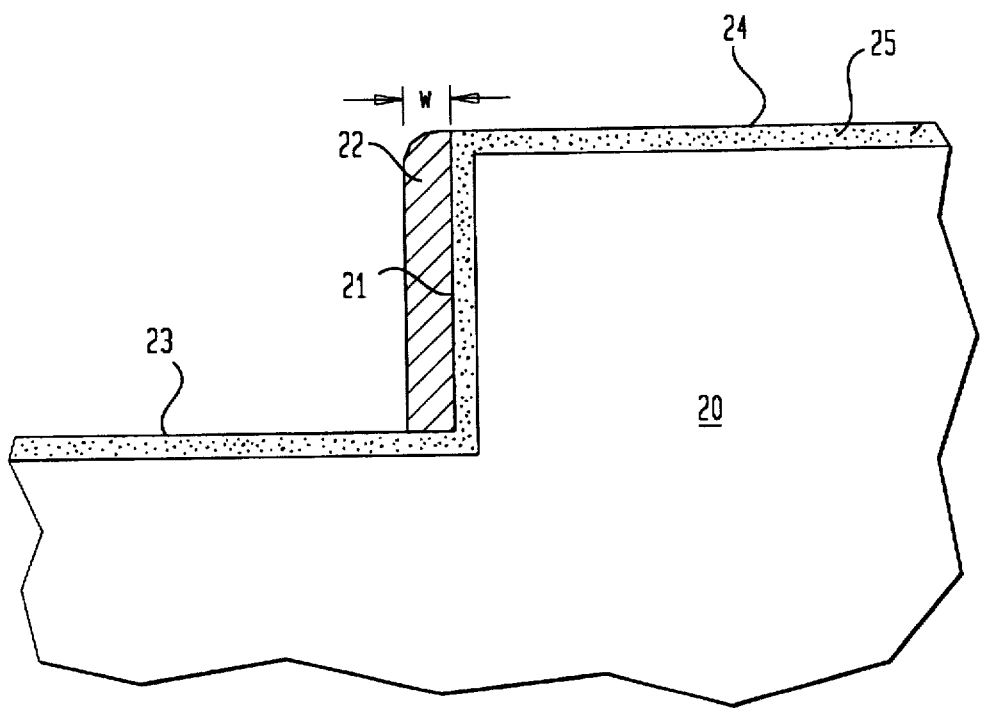

After this third RIE etch step, the polysilicon layer 22 is accurately defined, as illustrated in FIG. 2D.

The above two processes are exemplary implementations of the present invention. It is obvious for someone skilled in the art that some of the steps can be modified or carried out differently without deviating from the inventive concept. For example, the described patterning of the photoresist is only one possible way of providing a mask for a subsequent RIE step. There are other approaches known in the art. One may for example employ an oxide layer serving as mask for RIE processing. One may also use X-ray lithography instead of the conventional optical lithography. Under certain circumstances there is no need for a mask at all (see second sequence of steps). This is also referred to as maskless RIE process. The latter process is well suited for the manufacturing of vertical field effect transistors (FETs), for example.

The process described and illustrated in connection with FIGS. 2A–2D can be simplified if one continues the first RIE step until the protective layer 25 is exposed. Then, the second RIE can be carried out to remove the ear-like structures. There is no need for a third RIE etch step. It is a disadvantage of this approach that the protective layer 25 may be attacked by the RIE steps. Furthermore, the selection of proper RIE parameters for the second RIE step is more complicated, because particular care has to be taken that the protective layer 25 and the underlaying structure 20 are not detrimentally affected.

Figure 3:
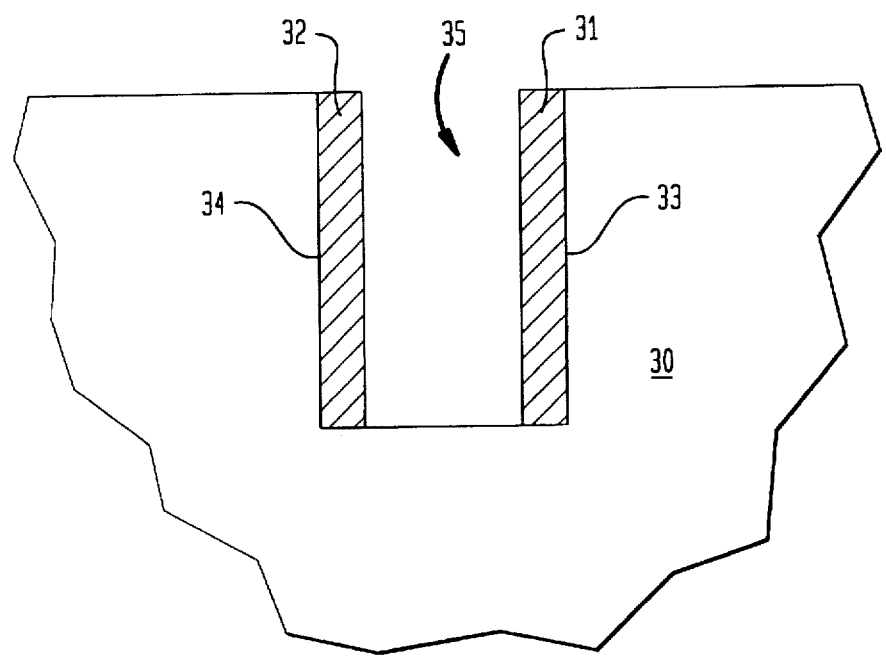
FIG. 3 is a schematic cross-section of polysilicon layers formed on the sidewalls of a trench.
Figure 4:
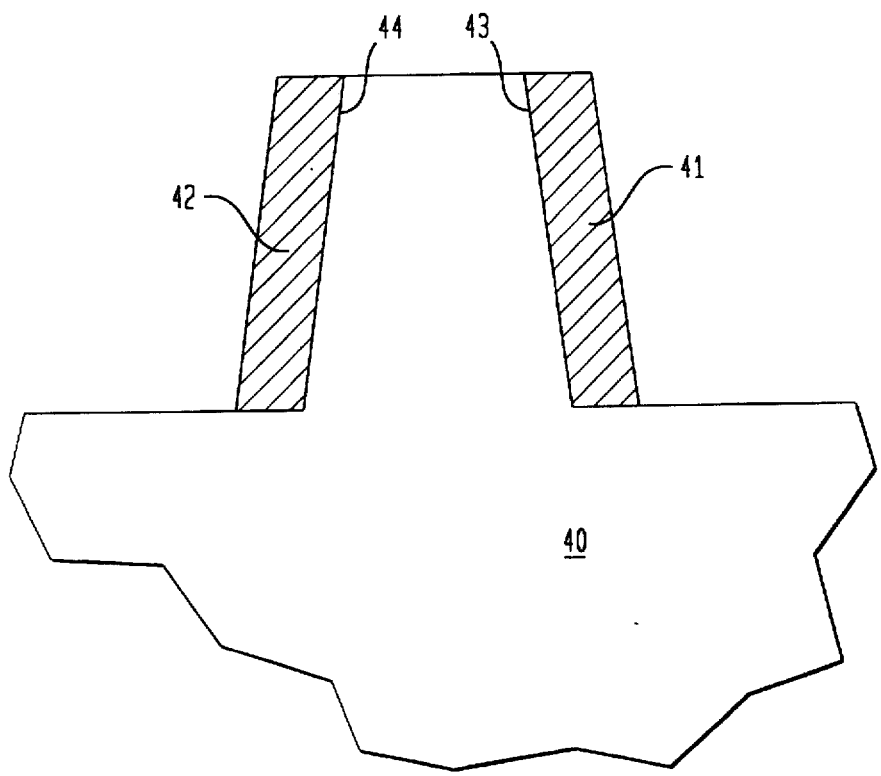
FIG. 4 is a schematic cross-section of polysilicon layers formed on the sidewalls of an elevation, ridge, or berm.

Two semiconductor structures which can be easily made using the present invention are illustrated in FIGS. 3 and 4. In FIG. 3, a semiconductor structure 30 with trench 35 is illustrated. The trench 35 has vertical sidewalls 33 and 34 which are covered by two doped polysilicon layers 31 and 32. The inventive process allows to precisely control size and shape of the two polysilicon layers 31 and 32.

The semiconductor structure 40, illustrated in FIG. 4, has two sloped surfaces 43 and 44. Both these surfaces 43, 44 carry polysilicon layers 41 and 42. Such a structure can be precisely made using the inventive process.

In the following, a vertical FET with an n-doped gate conductor is addressed. It is to be noted that FETs with p-doped gate conductor have a similar structure, but p- and n-type regions are reversed, and a voltage of opposite sign produces current flow.

Figure 5A:
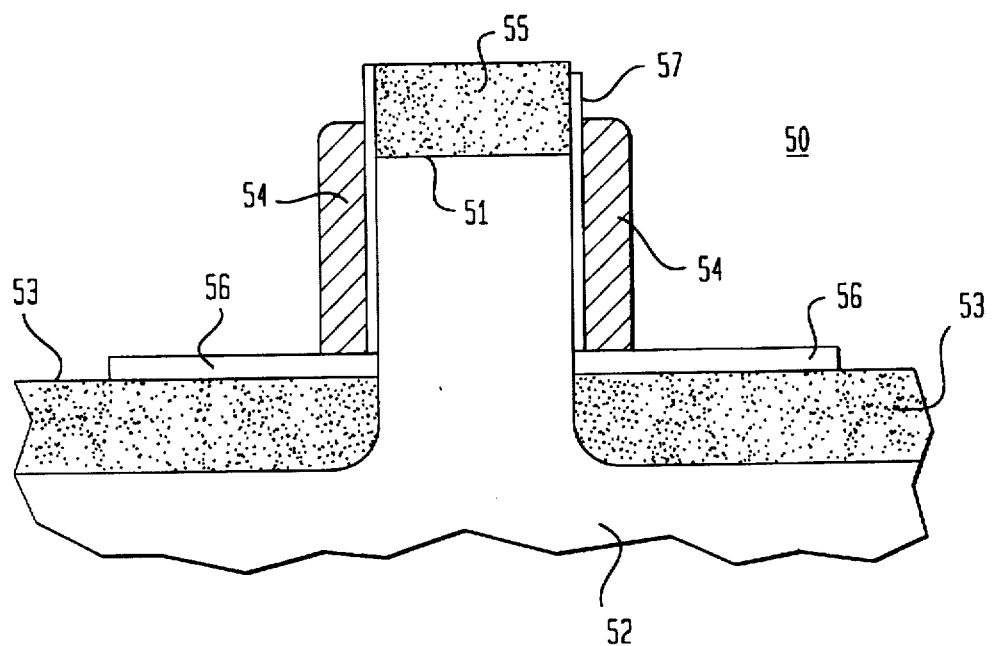
FIG. 5A is a schematic cross-section of a vertical field-effect transistor comprising a polysilicon layer formed on the sidewalls of the gate channel.
Figure 5B:
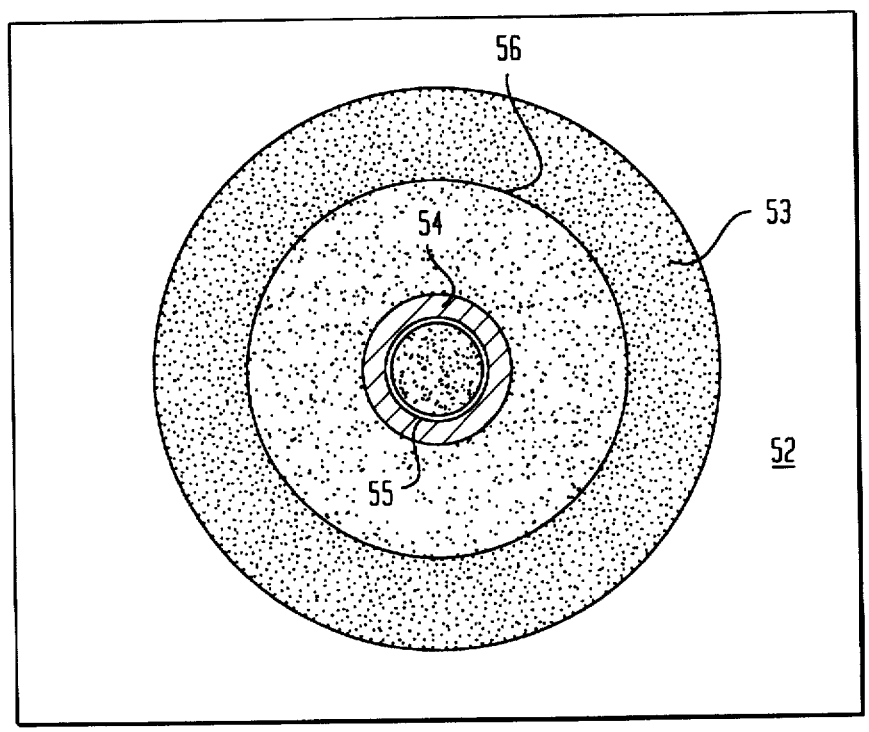
FIG. 5B is a schematic top view of the vertical field-effect transistor of FIG. 5A.

A vertical FET 50—made using the inventive process—is schematically illustrated in FIG. 5B. It comprises a vertical (i.e. perpendicular with respect to the semiconductor substrate 52 on which the FET 50 is formed) gate channel 51. This gate channel 51 usually consists of undoped silicon. An n+ doped source electrode 53 is formed in the substrate 52. An n+ doped drain electrode 55 is formed at the upper end of the gate channel 51. On the vertical sidewall of the gate channel 51 a thin oxide (usually $SiO_2$) layer 57 is formed. A doped polysilicon layer 54 is formed using the inventive sequence of steps, such that it conforms to said thin oxide 57. This polysilicon layer 54 serves as gate conductor. A thin insulator 56 (e.g. $SiO_2$) is situated between the source electrode 53 and the polysilicon layer 54. The respective top view is given in FIG. 5B (please note that the top view is reduced in size).

The above FET 50 has a pillar-like shape with a circular cross-section in the plane of the substrate 52, as can be seen in FIG. 5A. Likewise, it may have a square or rectangular cross-section.

The gate channel 51 is the area between the source 53 and drain electrodes 55 of FET 50. It is selectively made conductive or non-conductive to effect the desired operation. A well defined gate channel 51 and polysilicon layer 54 are crucial for the operation of such an FET. However, as the desired size of such channels and the adjacent polysilicon layer get increasingly smaller, inaccuracies of the manufacturing process can easily cause the small channel to be short-circuited rendering the respective FET and eventually the whole device—of which the FET is only one part—non-functional. In addition, the dimensions of the channel and the polysilicon layer control the electrical characteristics of the device. The performance of an FET depends very much on the geometry of the device, the doping profile and quality of the materials proximate the surfaces and so forth. This requires that the dimensions of the polysilicon gate conductor 54 are controlled precisely.

The inventive process can be used to make a vertical FET because it allows to precisely define the size and shape of the polysilicon gate conductor being an essential part of such an FET.

The inventive process works for every polysilicon doping and polysilicon grain structure.

It is immediately obvious from the above description that the present invention is suited for batch fabrication. All polysilicon layers of one device level can be made using one and the same sequence of inventive steps. This sequence of steps can be repeated whenever a level is reached where polysilicon layers are required. This allows to make multi-level structures of high density.

The maskless process, according to the present invention can be carried out in one and the same RIE etch chamber. This leads to a simplification of the handling of semiconductor structures, because there is no need to transfer the structure from a first processing chamber into second one.

The inventive process can be used to make any kind of discrete semiconductor devices, as well as integrated devices such as very large scale integrated (VLSI) and ultra large scale integrated (ULSI) devices, for example. The inventive method is well suited for making random access memories (RAMs), read only memories (ROMs), erasable programmable read only memories (EPROMs), electrically erasable programmable read only memories (EEPROMs), and programmable logic arrays (PLAs)

The inventive process is also well suited for making micromechanical devices in silicon.

We claim:

1. Method for creating a doped polysilicon layer of accurate shape on a sidewall of a semiconductor structure, comprising the steps of:
   (a) depositing a polysilicon film covering at least part of said semiconductor structure and of said sidewall,
   (b) doping said polysilicon film, (c) etching said polysilicon film using a reactive ion etching (RIE) process using reactive ion etching parameters providing for a high etch rate of said polysilicon film in order to define the approximate shape of said polysilicon layer on said sidewall, and (d) etching said polysilicon layer using a low polysilicon etch rate reactive ion etching process applying a high bias voltage such that non-uniformities of the surface of said polysilicon layer are removed by sputtering.

2. Method of claim 1, wherein the first and second steps (a) and (b) are carried out concurrently, i.e., wherein said polysilicon film is doped while being deposited.

3. Method of claim 1, wherein at least one of the following species, or any combination thereof, is used for the first reactive ion etching process step (a): Cl, Br, C, Ar, F, and He.

4. Method of claim 3, wherein a plasma is used which comprises: $Cl_2$, HBr, He, $CHF_3$, or $CF_4$ and Ar.

5. Method of claim 1,
wherein the first reactive ion etch step (a) is stopped before said polysilicon film is completely removed from surfaces other than said sidewall, thus leaving a thin layer of polysilicon on these surfaces, and wherein a third reactive ion etch step is carried out after the second reactive ion etch step (b), to remove said thin layer of polysilicon from surfaces other than said sidewall.

6. Method of claim 5, wherein essentially the same reactive ion etching parameters are used for the third reactive ion etch step as were used for the first reactive ion etch step (a).

7. Method of claim 1, wherein the bias voltage, which is one of said reactive ion etching parameters used for the first reactive ion etching process step (a), is approximately 800V.

8. Method of claim 1, wherein at least one of the following species, or any combination thereof, is used for the second reactive ion etching process step (b): Cl, Br, C, Ar, or F.

9. Method of claim 1, wherein an appropriate mask is placed or formed on top of said semiconductor structure before said first reactive ion etching process step (a) is carried out, said mask protecting those portions which are not to be attacked.

10. Method of claim 1, wherein said first reactive ion etching process step (a) is a maskless process, said reactive ion etching parameters being chosen such that said polysilicon film is etch anisotropically.

11. Method of claim 5, wherein said first and second reactive ion etching process steps (a) and (b), and said third reactive ion etching process are carried out in the same processing chamber.

12. Method of claim 1, wherein said semiconductor structure is a partially processed semiconductor device.

13. Method of claim 1, wherein said semiconductor structure is a partially processed micromechanical device.

14. Method of claim 1, wherein said polysilicon layer on said sidewall is part of a semiconductor device, such as a vertical field-effect transistor (FET).

15. Method of claim 1, wherein said reactive ion etching parameters are chosen such that the selectivity of polysilicon to said semiconductor structure is at least 5.

16. Method of claim 1, wherein said sidewall is a sidewall of a depression or trench.

17. Method of claim 1, wherein said sidewall is a sidewall of an elevation, berm, or ridge.

18. Method of claim 1, wherein said semiconductor structure is a partially processed random access memory (RAM), read only memory (ROM), erasable programmable read only memory (EPROM), electrically erasable programmable read only memory (EEPROM), or programmable logic array (PLA).

19. Method for making a vertical field effect transistor in a substrate, comprising the steps:

(a) defining a source electrode in said substrate by means of doping, (b) forming a vertical gate channel, (c) forming a drain electrode on the end of said gate channel being opposite to the end where said source electrode is situated, (d) providing a thin gate oxide on the sidewalls of said gate channel, (e) depositing a polysilicon film covering part of said substrate and part of said thin gate oxide on said sidewall, (f) doping said polysilicon film, (g) etching said polysilicon film using a reactive ion etching (RIE) process using reactive ion etching parameters providing for a high etch rate of said polysilicon film in order to define the approximate shape of said polysilicon layer on said thin gate oxide, said reactive ion etching process being stopped before said polysilicon film is completely removed from surfaces other than said sidewall, thus leaving a thin polysilicon layer on these surfaces, (h) etching said polysilicon layer using a low polysilicon etch rate reactive ion etching process applying a high bias voltage such that non-uniformities of the surface of said polysilicon layer are removed by sputtering, (i) etching said polysilicon film using a reactive ion etching process to remove thin polysilicon layer on said surfaces other than said sidewall.

20. Method of claim 19, wherein the steps (e) and (f) are carried out concurrently, i.e., wherein said polysilicon film is doped while being deposited.

21. Method of claim 19, wherein said first reactive ion etching process step (g) is a maskless process, said reactive ion etching parameters being chosen such that said polysilicon film is etch anisotropically.

* * * * *